(12) United States Patent
Chou

(10) Patent No.: US 9,467,146 B2
(45) Date of Patent: Oct. 11, 2016

(54) OUTPUT CIRCUIT ADAPTED FOR INTEGRATED CIRCUIT AND ASSOCIATED CONTROL METHOD

(71) Applicant: MStar Semiconductor, Inc., Hsinchu Hsien (TW)

(72) Inventor: Shun-Tien Chou, Zhubei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 0 days.

(21) Appl. No.: 14/607,167

(22) Filed: Jan. 28, 2015

(65) Prior Publication Data

US 2015/0214949 A1 Jul. 30, 2015

(30) Foreign Application Priority Data

Jan. 28, 2014 (TW) .............................. 103103069 A

(51) Int. Cl.
*H03K 19/0185* (2006.01)
*H03K 19/0175* (2006.01)

(52) U.S. Cl.
CPC ................. *H03K 19/018514* (2013.01); *H03K 19/017509* (2013.01)

(58) Field of Classification Search
CPC ............. H03K 19/018528; H03K 19/018514; H03K 5/151; H04L 25/0272; H04L 25/028; H04L 12/10; H04L 25/0282; H04L 25/0286; H04L 25/03038; G06F 13/4077; H03F 2203/45466; H03F 2203/45641; H03F 2203/45671; H03F 2203/45672; H03F 2203/45691; H03F 2203/45702; H03F 2203/45722; H03G 1/007; H04B 1/1081
USPC ...................................................... 326/82–87
See application file for complete search history.

(56) References Cited

U.S. PATENT DOCUMENTS

| 6,809,591 | B1 | 10/2004 | Ohashi |  |
|---|---|---|---|---|
| 7,408,387 | B2 | 8/2008 | Suenaga |  |
| 9,325,361 | B2* | 4/2016 | Tajalli | H03K 5/007 |
| 2004/0000680 | A1* | 1/2004 | Swartz | G06F 13/4077 257/274 |
| 2004/0022311 | A1* | 2/2004 | Zerbe | H04L 25/03038 375/229 |
| 2005/0258875 | A1* | 11/2005 | Wang | H03K 19/018528 327/108 |
| 2006/0220674 | A1* | 10/2006 | Yeung | H03K 19/018528 326/29 |
| 2009/0267818 | A1* | 10/2009 | Schofield | H03K 5/135 341/144 |
| 2009/0289668 | A1* | 11/2009 | Baldisserotto | H03K 19/09432 327/108 |

OTHER PUBLICATIONS

Taiwan Office Action, Jun. 11, 2015, 7 pages.

* cited by examiner

*Primary Examiner* — Alexander H Taningco
*Assistant Examiner* — Seokjin Kim
(74) *Attorney, Agent, or Firm* — Edell, Shapiro & Finnan, LLC

(57) ABSTRACT

An output circuit adapted for an integrated circuit is provided. The output circuit includes a driver, a pre-driver and a buffer circuit. The driver is electrically connected to two output nodes outside the integrated circuit to output signals. The pre-driver controls the driver, and includes a load and an input transistor connected in series. Between the load and the input transistor is a connection node for controlling the driver. The buffer circuit controls the load and the input transistor according to an internal signal. Before turning off the input transistor, the buffer circuit pre charges the connection node through the load.

12 Claims, 5 Drawing Sheets

OUTPUT CIRCUIT ADAPTED FOR INTEGRATED CIRCUIT AND ASSOCIATED CONTROL METHOD

This application claims the benefit of Taiwan application Serial No. 103103069, filed Jan. 28, 2014, the subject matter of which is incorporated herein by reference.

BACKGROUND OF THE INVENTION

1. Field of the Invention

The invention relates in general to an output circuit of an integrated circuit, and more particularly to an output circuit capable of steadily outputting a common mode signal and an associated control method.

2. Description of the Related Art

Communications between electronic products may be achieved through physical transmission lines and special communication standards. Differential signals are adopted by many communication standards to achieve quite high communication signal transmission speeds. However, for high-speed communications, transmission lines often require a termination resistor for reducing signal reflection and increasing the transmission speed. For example, in a receiver integrated circuit (or referred to as a sink integrated circuit), a termination resistor is installed and connected between a bonding pad and a power line.

Generally, circuit structures in a common integrated circuit can be functionally divided into two categories—a core circuit and an input/output circuit. The core circuit is in charge of signal processing or conversion in the integrated circuit; the input/output circuit serves as a communication window or bridge between the integrated circuit and external electronic devices. With the progressing evolvement of semiconductor processes and requirements on computation speeds, a core power voltage of the core circuit also continually becomes lower. In response, an input/output circuit needs to have a sufficient driving capability as well as capabilities for matching with external electronic devices. As a result, an input/output power voltage of the input/output circuit is frequently far higher than the core power voltage of the core circuit. For example, an input/output voltage may be maintained at 3.3V, whereas a core power voltage may be as low as 0.9V. When the core power voltage is as low as 0.9V, many unknown and unprecedented issues are incurred. Therefore, there is a need for such issues.

SUMMARY OF THE INVENTION

An output circuit adapted for an integrated circuit is provided according to an embodiment of the present invention. The output circuit includes a driver, a pre-driver and a buffer circuit. The driver is electrically connected to two output nodes outside the integrated circuit to output signals. The pre-driver controls the driver, and includes a load and an input transistor connected in series. Between the load and the transistor is a connection node for controlling the driver. The buffer circuit controls the load and the input transistor according to an internal signal. Before the input transistor is controlled to be turned off, the buffer circuit pre charges the connection node through the load.

A control method for an output circuit adapted for an integrated circuit is provided. The output circuit includes a pre-driver and a driver that are signally cascaded. The driver is electrically connected to two output nodes outside the integrated circuit to output signals. The pre-driver includes a load and an input transistor connected in series. Between the load and the input transistor is a connection node electrically connected to the driver. The control method includes: pre charging the connection node through the load according to an internal signal; and turning off the input transistor according to the internal signal after pre charging the connection node through the load.

A control method for an output circuit adapted for an integrated circuit is further provided according to an embodiment of the present invention. The output circuit includes a driver and a pre-driver. The driver is electrically connected to two output nodes outside the integrated circuit to output signals. The pre-driver includes a non-inverted output and an inverted output. The control method includes: according to an internal signal, first causing a voltage of the inverted output to start to approach a power line voltage and then causing a voltage of the non-inverted output to start to depart the power line voltage; and controlling the driver according to the voltage of the non-inverted output and the voltage of the inverted output. A time point at which the voltage of the inverted output starts to approach the power line voltage is earlier than a time point at which the voltage of the non-inverted output voltage starts to depart the power line voltage.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
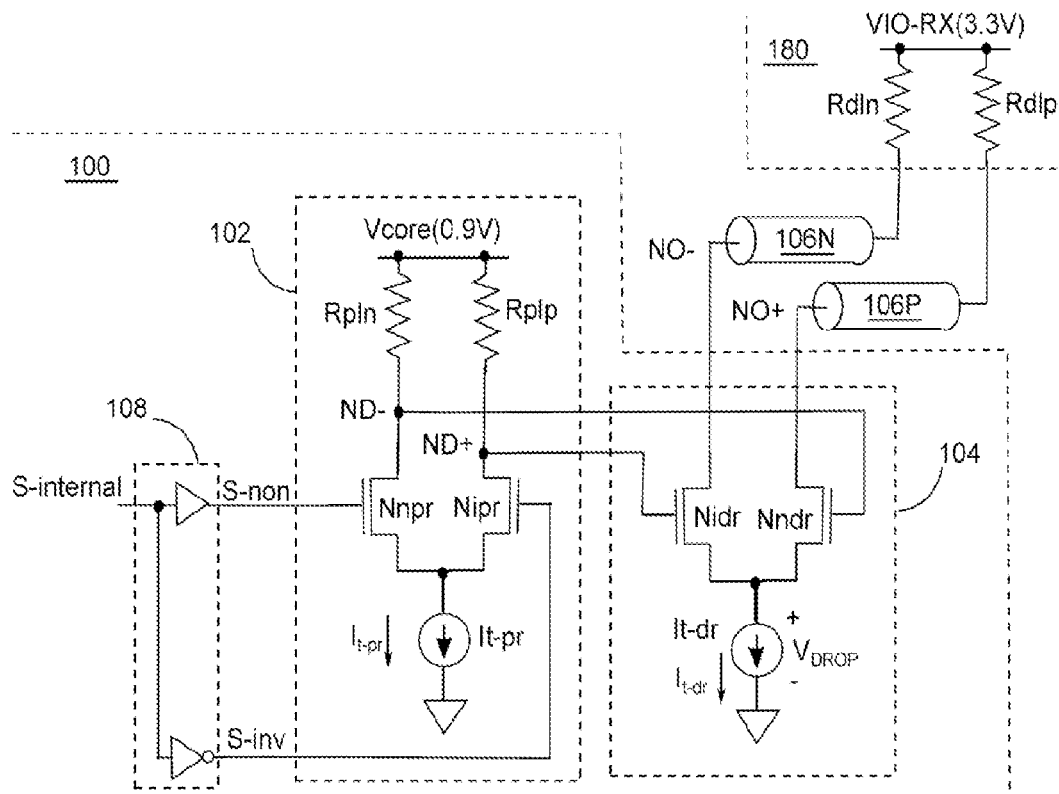
FIG. 1 shows a source integrated circuit and a sink integrated circuit.

FIG. 1 shows an output circuit 100 in a transmitter integrated circuit (or referred to as a source integrated circuit). The output circuit 100 is electrically connected to a receiver integrated circuit (or referred to as a sink integrated circuit) 180 via transmission lines 106N and 106P, and includes a buffer circuit 108, a pre-driver 102 and a current-mode driver 104. The current-mode driver 104 is electrically connected to two termination resistors Rnln and Rdlp in the receiver integrated circuit 180 via the transmission lines 106N and 106P outside the transmitter integrated circuit. The termination resistors Rdln and Rdlp are electrically connected to a 3.3V input/output power line VIO-RX in the receiver integrated circuit 180.

According to an internal signal $V_{S\text{-}internal}$ on an internal node S-internal, the buffer circuit 108 generates a non-inverted signal $V_{S\text{-}non}$ and an inverted signal $V_{S\text{-}inv}$ that are substantially logically inverted at the non-inverted end S-non and the inverted end S-inv, respectively. In non-limiting embodiments throughout the disclosure, logic "1" represents a high voltage and logic "0" inverted from logic "1" represents a low voltage.

The pre-driver 102 includes two NMOS transistors Nnpr and Nipr, two load resistors Rpln and Rplp, and a current source It-pr. The NMOS transistor Nnpr, the load resistor Rpln and the current source It-pr are connected in series between a core power line Vcore (0.9V) and a ground line (0V). Similarly, the NMOS transistor Nipr, the load resistor Rplp and the current source It-pr are connected in series between the core power line Vcore and the ground line. A connection node ND− between the NMOS transistor Nnpr and the load resistor Rpln is electrically connected to and controls an NMOS transistor Nndr in the current mode driver 104. A connection node ND+ between the NMOS transistor Nipr and the load resistor Rplp is electrically connected to and controls an NMOS transistor Nidr in the current mode driver 104. In short, by switching a current $I_{t-pr}$ of the current source It-pr to flow through the load resistor Rpln or Rplp, the NMOS transistors Nnpr and Nipr determine signals $V_{ND-}$ and $V_{ND+}$ on the connection nodes ND− and ND+. Thus, the non-inverted signal $V_{S-non}$ and the inverted signal $V_{S-inv}$ may be regarded as two current switching signals. The connection nodes ND− and ND+ may be respectively regarded as an inverted output and a non-inverted output of the pre-driver 102.

The NMOS transistors Nndr and Nidr in the current mode driver 104 are jointly electrically connected to the current source It-dr. Similarly, the NMOS transistors Nndr and Nidr may switch the current $I_{t-dr}$ of the current source It-dr to flow through the termination resistor Rdln or Rdlp to accordingly determine output signals $V_{NO-}$ and $V_{NO+}$ on output nodes NO− and NO+.

Figure 2:
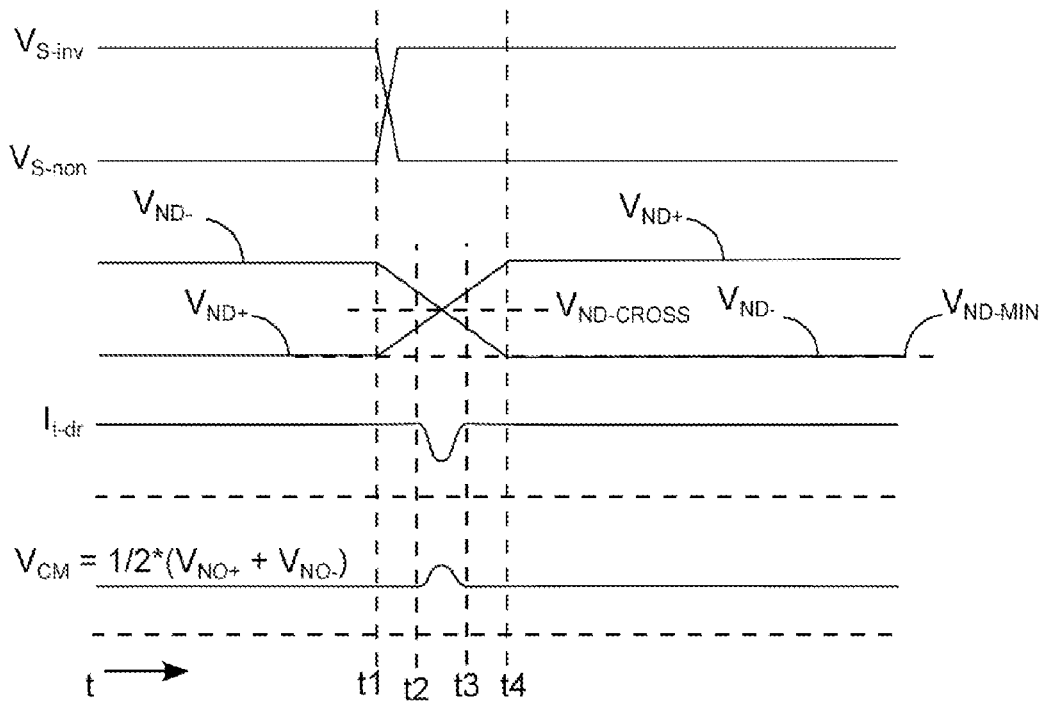
FIG. 2 shows some signal waveforms in the source integrated circuit in FIG. 1.

FIG. 2 shows some signal waveforms in FIG. 1. As voltage values of the non-inverted signal $V_{S-non}$ and the inverted signal $V_{S-inv}$ change at a time point t1, logic values of these signals are changed, and voltage values of the signals $V_{ND-}$ and $V_{ND+}$ in the pre-driver 102 also start to change. Such changes are completed until a time point t4. In a period between time points t2 and t3, the signals $V_{ND-}$ and $V_{ND+}$ intersect. In FIG. 2, the signals $V_{ND-}$ and $V_{ND+}$ intersect at a crossover voltage $V_{ND-CROSS}$. To have a sufficient signal swing, minimum voltage values $V_{ND-MIN}$ of the signals $V_{ND-}$ and $V_{ND+}$ are kept as low as possible. Expectantly, the crossover voltage $V_{ND-CROSS}$ gets lower as the minimum voltage values $V_{ND-MIN}$ get lower.

It should be noted that, the current source It-dr in the current mode driver 104 needs to have a sufficient cross voltage $V_{DROP}$ to maintain an expected constant value of the current $I_{t-dr}$. However, as shown in FIG. 2, in the period between the time points t2 and t3, the cross voltage $V_{DROP}$ is inadequate due to low values of the signals $V_{ND-}$ and $V_{ND+}$, leading a reduced value of the current source $I_{t-dr}$ instead of being the expected constant value.

The unstable current $I_{t-dr}$ aggravates electromagnetic interference (EMI). In FIG. 2, an output common mode signal $V_{CM}$ represents an average value of the output signals $V_{NO-}$ and $V_{NO+}$. When resistance values of the termination resistors Rdln and Rdlp are a constant value of $R_{LOAD}$, the voltage of the output common mode signal $V_{CM}$ is about $(3.3 - 0.5 * I_{t-dr} * R_{LOAD})$ Volts. When the current $I_{t-dr}$ is a constant value, it can be deduced that the output common mode signal $V_{CM}$ is also about a constant voltage. However, as the current $I_{t-dr}$ reduces, the output common mode signal $V_{CM}$ increases, as shown in FIG. 2. An unstable output common mode signal $V_{CM}$ produces greater EMI. In other words, when the signals $V_{ND-}$ and $V_{ND+}$ are too low, i.e., when the crossover voltage $V_{ND-CROSS}$ is too low, greater undesired EMI may be caused.

Figure 3:
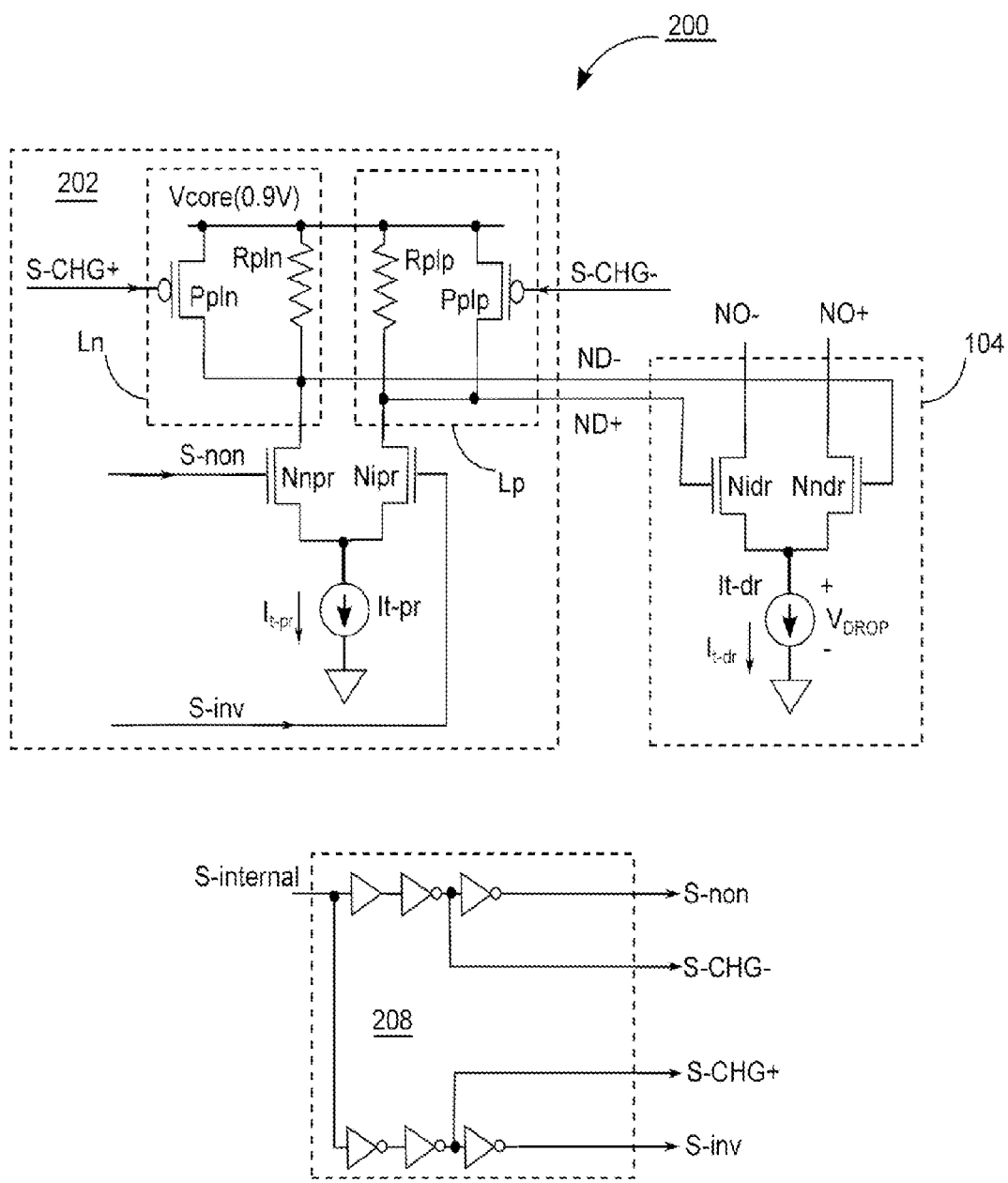
FIG. 3 shows an output circuit according to an embodiment of the present invention.

FIG. 3 shows an output circuit 200 according to an embodiment of the present invention. In one embodiment, the output circuit 200 replaces the output circuit 100 in FIG. 1. Although not depicted in FIG. 3, the output circuit 200 in the embodiment in FIG. 3 may electrically connect to the sink integrated circuit 180 via the transmission lines 106N and 106P in FIG. 1. For illustration purposes, denotations in FIG. 3 that are same as those in FIG. 1 represent elements, materials or substances that are functionally identical or similar, and associated details are omitted herein. However, the above is not to be construed as a limitation to the present invention. In other embodiments, elements with the same denotations may be implemented by different circuits, materials or structures.

In FIG. 3, a buffer circuit 208 provides a pre-driver 202 with a signal, and the pre-driver 202 provides the signal to the current mode driver 104. Therefore, the buffer circuit 208, the pre-driver 202 and the current mode driver 104 form a signally cascaded structure.

Compared to the pre-driver 102 in FIG. 1, the pre-driver 202 in FIG. 3 additionally includes PMOS transistors Ppln and Pplp. The PMOS transistor Ppln and the load resistor Rpln connected in parallel form a load Ln, and the PMOS transistor Pplp and the load resistor Rplp form another load Lp. The PMOS transistors Ppln and Pplp include control nodes S-CHG+ and S-CHG− that carry load control signals $V_{S-CHG+}$ and $V_{S-CHG-}$, respectively.

Compared to the buffer circuit 108 in FIG. 1, the buffer circuit 208 in FIG. 3 is further electrically connected to the control nodes S-CHG+ and S-CHG−. As seen from the electrical connection of the buffer circuit 208, the load control signals $V_{S-CHG+}$ and $V_{S-CHG-}$ are generated from delaying the internal signal $V_{S-internal}$ on the internal node S-internal, with however the logic values of the load control signals $V_{S-CHG+}$ and $V_{S-CHG-}$ being inverted to each other. In other words, when the load control signal $V_{S-CHG+}$ is at high voltage in logic 1, the load control signal $V_{S-CHG-}$ is at a low voltage in logic 0. Similarly, the non-inverted signal $V_{S-non}$ and the inverted signal $V_{S-inv}$ are generated from respectively delaying the load control signals $V_{S-CHG+}$ and $V_{S-CHG-}$, and so the logic values of the non-inverted signal $V_{S-non}$ and the inverted signal $V_{S-inv}$ are also inverted.

Figure 4:
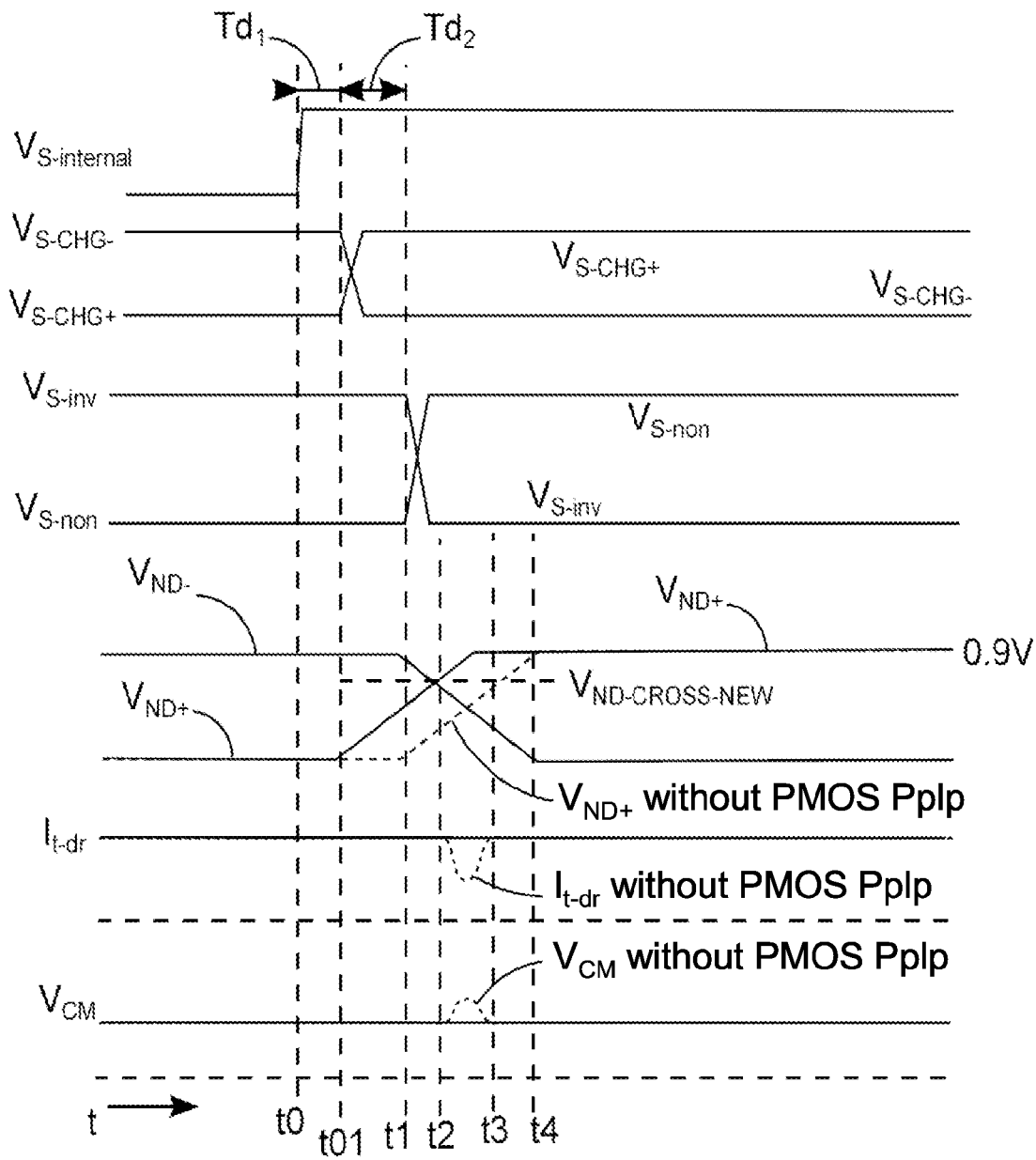
FIG. 4 shows some signal waveforms and timing relations in FIG. 3.

FIG. 4 shows some signal waveforms and timing relations in FIG. 3. In FIG. 4, signal delay periods from the internal signal $V_{S-internal}$ to the load control signals $V_{S-CHG+}$ and $V_{S-CHG-}$ are both about $Td_1$; a signal delay period from the load control signal $V_{S-CHG+}$ or $V_{S-CHG-}$ to the non-inverted signal $V_{S-non}$ or the inverted signal $V_{S-inv}$ is about $Td_2$. It can be concluded that, a signal delay period from the internal signal $V_{S-internal}$ to the non-inverted signal $V_{S-non}$ or the inverted signal $V_{S-inv}$ is about $Td_1 + Td_2$.

Before the time point t0, the non-inverted signal $V_{S-non}$ and the inverted signal $V_{S-inv}$ are respectively at a low voltage (logic 0) and a high voltage (logic 1), and so almost all of the current $I_{t-pr}$ flows through the NMOS transistor Nipr. As a result, the signal $V_{ND+}$ is at a low voltage, and the signal $V_{ND-}$ is at a high voltage, as shown in FIG. 4.

As shown in FIG. 4, at the time point t0, the internal signal $V_{S-internal}$ changes from a low voltage (logic 0) to a high voltage (logic 1).

At the time point t01 after the signal delay period $Td_1$, the load control signals $V_{S-CHG+}$ and $V_{S-CHG-}$ start to change. The voltage of the load control signals $V_{S-CHG+}$ increases and channel impedance of the PMOS transistor Ppln increases, and thus impedance of the load Ln increases.

Conversely, the voltage of load control signals $V_{S-CHG-}$ decreases, and thus the impedance of the load Lp decreases. At the time point t01, as originally almost no current flows through the NMOS transistor Nnpr and the load Ln, the increase in the load Ln does not affect the signal $V_{ND-}$, which then still remains at a high voltage, e.g., 0.9V of the core power line Vcore. At the time point t01, as almost all of the current $I_{t-pr}$ flows through the load Lp, the impedance of the load Lp is reduced to pull up the voltage of the signal $V_{ND+}$ to approach 0.9V, as shown in FIG. 4.

At a time point t1 after the signal delay period $Td_2$, the non-inverted signal $V_{S-non}$ and the inverted signal $V_{S-inv}$ start to change. At this point, the impedance of the NMOS transistor Nnpr decreases, and the impedance of the NMOS transistor Nipr increases. Instead of flowing through the load Lp, the current $I_{t-pr}$ is switched to flow through the load Ln. As a result, the signal $V_{ND-}$ starts to drop from 0.9V, and the signal $V_{ND+}$ keeps ascending or maintains at 0.9V.

The load control signals $V_{S-CHG+}$ and $V_{S-CHG-}$ are equivalently two feed-forward signals, which change the impedance of the loads Lp and Ln in advance before the time point t01 at which the impedance of the NMOS transistors NMOS Nnpr and Nipr is changed. As shown in FIG. 4, the result of the feed-forward signals causes the signal ND+ to starts rising at the time point t01 and the signal ND− to start dropping at the time point t1.

Referring to FIG. 4, some dotted lines are depicted to replicate the signal $V_{ND+}$, the current $I_{t-dr}$ and the output common mode signal $V_{CM}$ in FIG. 2 for comparison purposes. In the embodiments in FIG. 3 and FIG. 4, as the signal $V_{ND+}$ starts to rise at the time point t01, the crossover voltage $V_{ND-CROSS-NEW}$ of the signals $V_{ND+}$ and $V_{DN-}$ is higher compared to the crossover voltage $V_{ND-CROSS}$ in FIG. 2. Given an appropriate design, the higher crossover voltage $V_{ND-CROSS-NEW}$ can ensure that the current source $I_{t-dr}$ in FIG. 3 has a sufficient cross voltage $V_{DROP}$ to keep the current source $I_{t-dr}$ and the output common mode signal $V_{CM}$ in constant values, as shown in FIG. 4. In other words, the embodiment in FIG. 3 improves the EMI resulted by the unstable output common mode signal $V_{CM}$ in FIG. 1.

It is deduced from the description associated with FIG. 3 and FIG. 4 that, when the internal signal $V_{S-internal}$ changes from a high voltage in logic 1 to a low voltage in logic 0, the time point at which the signal $V_{ND-}$ starts to rise is earlier than the time point at which the signal $V_{ND+}$ starts to drop, hence obtaining a higher crossover voltage to similarly achieve stable $I_{t-dr}$ and output common mode signal $V_{CM}$.

Figure 5:
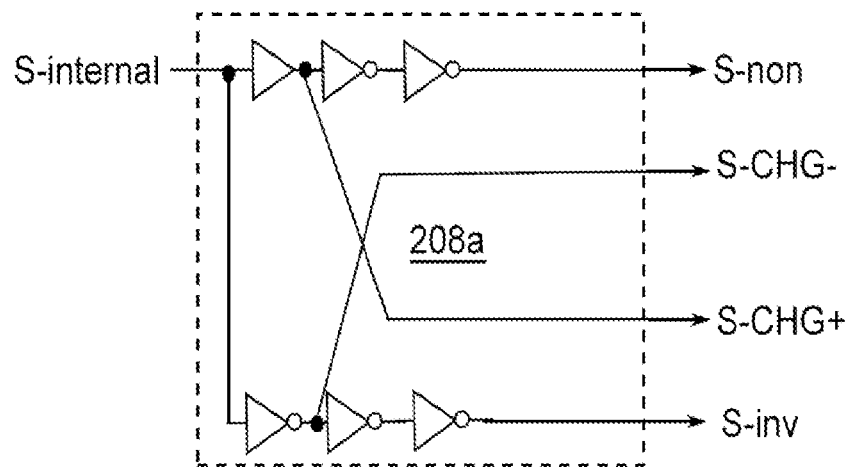
FIG. 5 shows a buffer circuit according to an embodiment of the present invention.

In FIG. 3, the non-inverted signal $V_{S-non}$ is generated from delaying the load control signal $V_{S-CHG-}$ as an example the present invention. FIG. 5 shows another buffer circuit 208a that may replace the buffer circuit 208 in other embodiments of the present invention. In FIG. 5, the non-inverted signal $V_{S-non}$ is generated from delaying the load control signal $V_{S-CHG+}$, and the inverted signal $V_{S-inv}$ is generated from delaying the load control signal $V_{S-CHG-}$.

Figure 6:
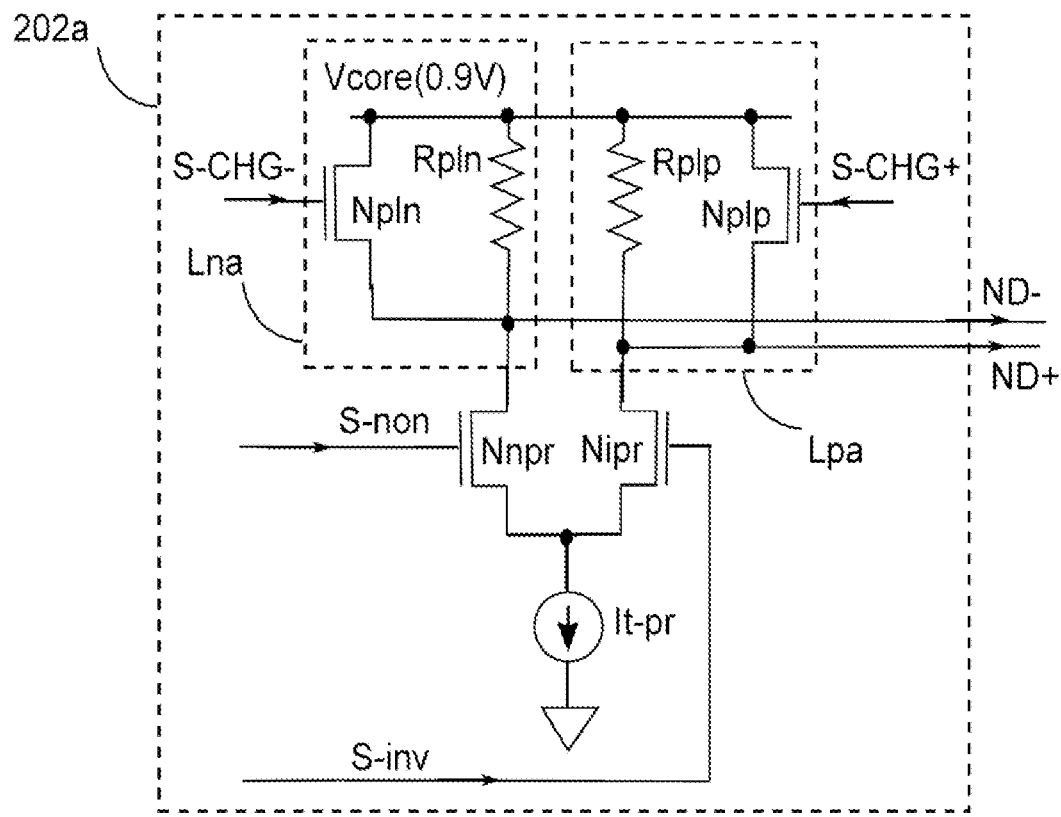
FIG. 6 shows a pre-driver according to another embodiment of the present invention.

FIG. 6 shows another pre-driver 202a that may replace the pre-driver 202 in FIG. 3 in other embodiments of the present invention. The pre-driver 202a changes impedance of loads Lna and Lpa by using the NMOS transistors Npln and Nplp. FIG. 4 may also be used to illustrate some signal waveforms in FIG. 6. The pre-driver 202a in FIG. 6 is capable of improving EMI.

Figure 7:
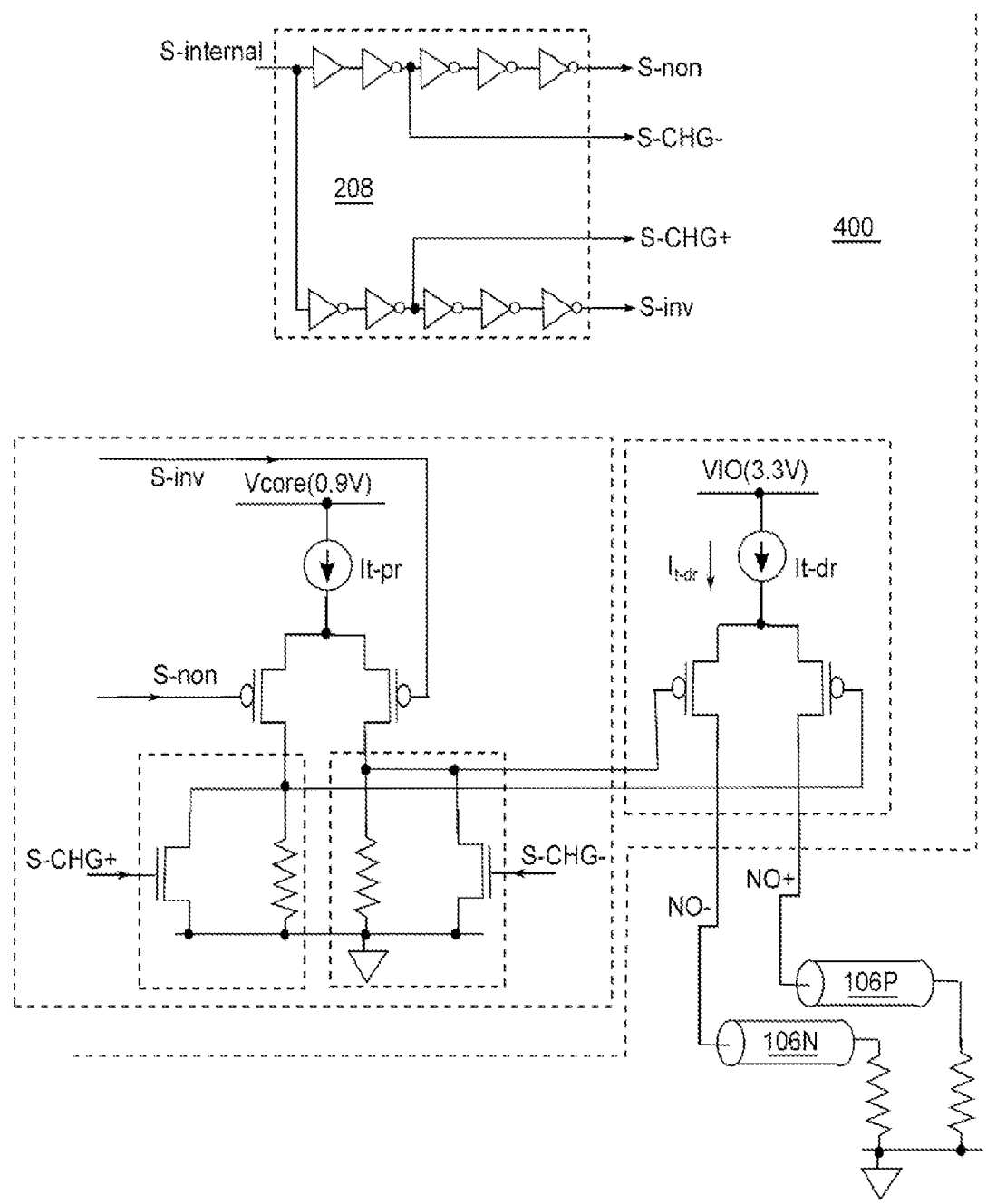
FIG. 7 shows an output circuit according to an embodiment of the present invention.

In the foregoing exemplary output circuits, an NMOS transistor is used as a current switch, e.g., the NMOS transistors Nnpr and Nipr in FIG. 1 are two current switches. It should be noted that the present invention is not limited to the foregoing examples. FIG. 7 shows an output circuit 400 according to another embodiment of the present invention, in which many PMOS transistors are used as current switches. Operations and effects of EMI improvements of FIG. 7 may be learned from the abovementioned description, and shall be omitted herein. In some embodiments, the NMOS transistors for changing load impedance may also be implemented by PMOS transistors.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An output circuit, adapted for an integrated circuit, comprising:
   a driver, electrically connected to two output nodes outside the integrated circuit to output signals;
   a pre-driver, configured to control the driver, comprising a load and an input transistor that are connected in series, wherein between the load and the input transistor is a connection node for controlling the driver; and
   a buffer circuit, configured to control the load and the input transistor according to an internal signal, and to pre charge the connection node through the load before turning off the input transistor,
   wherein the load and the input transistor are a first load and a first input transistor, respectively, the pre-driver further comprises a second load and a second input transistor that are connected in series, the buffer circuit turns on the second input transistor when turning off the first input transistor and increase impedance of the second load when pre charging the connection node.

2. The output circuit according to claim 1, wherein the buffer circuit delays an internal signal by a first delay period and a second delay period to generate a load control signal and a switching signal for controlling the load and the input transistor, respectively.

3. The output circuit according to claim 2, wherein the input transistor is a first input transistor, the pre-driver further comprises a second input transistor, the first input transistor and the second input transistor are controlled by an inverted signal and a non-inverted signal, respectively, and one of the inverted signal and the non-inverted signal is generated from delaying the load control signal.

4. The output circuit according to claim 2, wherein the load comprises a load transistor and a resistor that are connected in parallel, and the load control signal is for controlling the load transistor.

5. The output circuit according to claim 4, wherein the input transistor is an NMOS transistor, and the load transistor is a PMOS transistor.

6. The output circuit according to claim 1, wherein the buffer circuit increases the impedance of the load before turning on the input transistor.

7. The output circuit according to claim 1, wherein the pre-driver further comprises a current source, and the load and the input transistor are connected in series between a power line and the current source.

8. The output circuit according to claim 7, wherein the current source is a first current source, the driver is a current mode driver comprising a pair of transistors and a second current source, the second current source is connected between the pair of transistors and another power line, and the pair of transistors are electrically connected to the two output nodes.

9. A control method, for an output circuit adapted for an integrated circuit, the output circuit comprising a pre-driver and a driver that are signally cascaded, the driver configured to electrically connect to two output nodes outside the integrated circuit to output signals, the pre-driver comprising a load and an input transistor that are connected in series, between the load and the input transistor being a connection node electrically connected to the driver; the control method comprising:
 pre charging the connection node through the load according to an internal signal; and
 after pre charging the connection node through the load, turning off the input transistor according to the internal signal,
 wherein the load and the input transistor are a first load and a first input transistor, respectively, the pre-driver further comprising a second load and a second input transistor that are connected in series, the control method further comprising turning on the second input transistor when turning off the first input transistor and increasing impedance of the second load when pre charging the connection node.

10. The control method according to claim 9, the load being a first load, the input transistor being a first input transistor, the control method further comprising:
 increasing impedance of the second load according to the internal signal; and
 after increasing the impedance of the second load, turning on the second input transistor according to the internal signal.

11. The control method according to claim 9, further comprising:
 delaying the internal signal to generate a load control signal for reducing an impedance of the load; and
 delaying the internal signal to generate a switch signal for turning off the input transistor.

12. The control method according to claim 11, the load comprising a load transistor and a resistor, the load and the input transistor being connected in series between a power line and a current source, the control method further comprising:
 controlling the load transistor according to the load control signal; and
 controlling the input transistor according to the switch signal.

\* \* \* \* \*